(12) United States Patent
Chien (10) Patent No.: US 11,121,029 B2
(45) Date of Patent: Sep. 14, 2021

(54) SEMICONDUCTOR DEVICE WITH AIR SPACER AND METHOD FOR PREPARING THE SAME

(71) Applicant: NANYA TECHNOLOGY CORPORATION, New Taipei (TW)

(72) Inventor: Jung-Hsing Chien, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/547,099

(22) Filed: Aug. 21, 2019

(65) Prior Publication Data

US 2021/0057265 A1 Feb. 25, 2021

(51) Int. Cl.
| | |
|---|---|
| *H01L 21/768* | (2006.01) |
| *H01L 23/528* | (2006.01) |
| *H01L 23/532* | (2006.01) |
| *H01L 23/522* | (2006.01) |

(52) U.S. Cl.
CPC .... *H01L 21/7682* (2013.01); *H01L 21/76885* (2013.01); *H01L 23/528* (2013.01); *H01L 23/5226* (2013.01); *H01L 23/5329* (2013.01)

(58) Field of Classification Search
CPC .............. H01L 23/5226; H01L 21/764; H01L 21/7682
See application file for complete search history.

(56) References Cited

U.S. PATENT DOCUMENTS

| | | | |
|---|---|---|---|
| 5,461,003 A | 10/1995 | Havemann et al. | |
| 5,783,864 A | 7/1998 | Dawson et al. | |
| 9,837,305 B1* | 12/2017 | Briggs | ............... H01L 23/5222 |
| 2003/0113298 A1 | 6/2003 | Fischetti et al. | |
| 2003/0168747 A1 | 9/2003 | Hussein et al. | |

OTHER PUBLICATIONS

Office Action dated Nov. 11, 2020 in TW Application No. 109113305 (5 pages).

* cited by examiner

*Primary Examiner* — Zandra V Smith
*Assistant Examiner* — John M Parker
(74) *Attorney, Agent, or Firm* — Muncy, Geissler, Olds & Lowe, P.C.

(57) ABSTRACT

The present disclosure provides a semiconductor device and a method for preparing the semiconductor device. The method includes forming a first conductive layer over a substrate, forming a first dielectric structure over the first conductive layer, transforming a sidewall portion of the first conductive layer into a first transformed portion, removing the first transformed portion such that a width of the first dielectric structure is greater than a width of a remaining portion of the first conductive layer, and forming an interlayer dielectric (ILD) layer covering sidewalls of the first dielectric structure such that a first air spacer is formed between the ILD layer and the remaining portion of the first conductive layer.

9 Claims, 8 Drawing Sheets

SEMICONDUCTOR DEVICE WITH AIR SPACER AND METHOD FOR PREPARING THE SAME

TECHNICAL FIELD

The present disclosure relates to a semiconductor device and a method for preparing the same, and more particularly, to a semiconductor device with an air spacer and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices is becoming increasingly complicated. An increase in complexity of manufacturing and integration of the semiconductor device may cause deficiencies, such as signal interference between conductive elements. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device comprises a plurality of composite pillars disposed over a substrate, wherein the composite pillars include conductive pillars and dielectric caps over the conductive pillars; a supporting pillar between adjacent two of the plurality of composite pillars; and a sealing layer at least contacts a top portion of the supporting pillar and a top of the dielectric cap, and air spacers are formed between the sealing layer, the supporting pillar and the remaining portions of the conductive pillars.

In some embodiments, a top end of the supporting pillar is horizontally aligned with a top end of the dielectric cap.

In some embodiments, a width of the conductive pillar is smaller than a width of the dielectric cap.

In some embodiments, the sealing layer has an intervening portion contacting the top portion of the supporting pillar and the top portion of the dielectric cap, and the intervening portion has a bottom end lower than a bottom end of the dielectric cap.

In some embodiments, the sealing layer has an intervening portion contacting the top portion of the supporting pillar and the top portion of the dielectric cap, and the intervening portion has a bottom end higher than a bottom end of the dielectric cap.

In some embodiments, the semiconductor device further comprises a first air spacer at one side of the conductive pillar and a second air spacer at the other side of the conductive pillar, wherein a first shape of the first air spacer is different from a second shape of the second air spacer.

In some embodiments, the semiconductor device further comprises a first air spacer at one side of the conductive pillar and a second air spacer at the other side of the conductive pillar, wherein a first size of the first air spacer is different from a second size of the second air spacer.

In some embodiments, the first air spacer is between the supporting pillar and the conductive pillar, the second air spacer is at the other side of the conductive pillar, and the first air spacer is larger than the second air spacer.

In some embodiments, a top end of the supporting pillar is higher than a bottom end of the dielectric cap.

In some embodiments, a top end of the supporting pillar is higher than a top end of the conductive pillar.

The present disclosure also provides a method for preparing a semiconductor device. The method comprises: forming a plurality of composite pillars over a substrate, wherein the composite pillars include conductive pillars and dielectric caps over the conductive pillars; transforming a sidewall portion of the conductive pillar into a first transformed portion; removing the first transformed portion such that a width of the dielectric cap is greater than a width of a remaining portion of the conductive pillar; forming a supporting pillar between adjacent two of the plurality of composite pillars; and forming a sealing layer at least contacts a top portion of the supporting pillar and a top of the dielectric cap, and air spacers are formed between the sealing layer, the supporting pillar and the remaining portions of the conductive pillars.

In some embodiments, the forming a supporting pillar between adjacent two of the plurality of composite pillars comprises: forming a temporary layer having an opening over the substrate, between the adjacent two of the plurality of composite pillars; forming the supporting pillar in the opening; and removing the temporary layer from the substrate, while leaving the supporting pillar between the adjacent two of the plurality of composite pillars.

In some embodiments, a sidewall of the first conductive layer is substantially coplanar with the sidewall of the first dielectric structure before the sidewall portion of the first conductive layer is transformed.

In some embodiments, the step of transforming the sidewall portion of the first conductive layer further comprises: performing a thermal treatment process on the first conductive layer to form the first transformed portion over opposite sidewalls of the remaining portion of the first conductive layer, wherein a material of the first transformed portion is different from a material of the first dielectric structure.

In some embodiments, the thermal treatment process is an oxidation process or a nitridation process, and the first transformed portion is covered by the first dielectric structure.

In some embodiments, the sealing layer has an intervening portion contacting the top portion of the supporting pillar and the top portion of the dielectric cap, and the intervening portion has a bottom end lower than a bottom end of the dielectric cap.

In some embodiments, the sealing layer has an intervening portion contacting the top portion of the supporting pillar and the top portion of the dielectric cap, and the intervening portion has a bottom end higher than a bottom end of the dielectric cap.

In some embodiments, the sealing layer is formed to enclose a first air spacer at one side of the conductive pillar and a second air spacer at the other side of the conductive pillar, a first shape of the first air spacer is different from a second shape of the second air spacer.

In some embodiments, the sealing layer is formed to enclose a first air spacer at one side of the conductive pillar and a second air spacer at the other side of the conductive pillar, a first size of the first air spacer is different from a second size of the second air spacer.

In some embodiments, the first air spacer is between the supporting pillar and the conductive pillar, the second air spacer is at the other side of the conductive pillar, and the first air spacer is larger than the second air spacer.

Embodiments of a semiconductor device and method for preparing the same are provided. The method for preparing the semiconductor device includes transforming sidewall portions of the conductive pillars into transformed portions (e.g., transformed portions) by performing one or multiple repetitions of thermal treatment processes and removing the abovementioned transformed portions such that the width of each of the dielectric structures (e.g., dielectric caps) is greater than the width of each of the remaining portions of the conductive layers (e.g., remaining portions of the conductive pillars). As a result, after the sealing layer is formed covering sidewalls of the dielectric structures, air spacers are formed between the sealing layer and the remaining portions of the conductive layers.

The formation of the air spacers over the sidewalls of the conductive layers aids in the prevention of crosstalk (i.e., signal interference or coupling) between adjacent conductive pillars, and the performance of the semiconductor devices may be improved. Moreover, because the sealing layer is formed over opposite sidewalls of the conductive layers after the conductive layers are formed, a pinch-off problem near the top of the conductive layers and creation of voids or seams in the conductive layers can be prevented.

In one embodiment of the present disclosure, a method for preparing a semiconductor device is provided. The method includes forming a first conductive layer over a substrate, and forming a first dielectric structure over the first conductive layer. The method also includes transforming a sidewall portion of the first conductive layer into a first transformed portion, and removing the first transformed portion such that a width of the first dielectric structure is greater than a width of a remaining portion of the first conductive layer. The method further includes forming an inter-layer dielectric (ILD) layer covering a sidewall of the first dielectric structure such that a first air spacer is formed between the ILD layer and the remaining portion of the first conductive layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
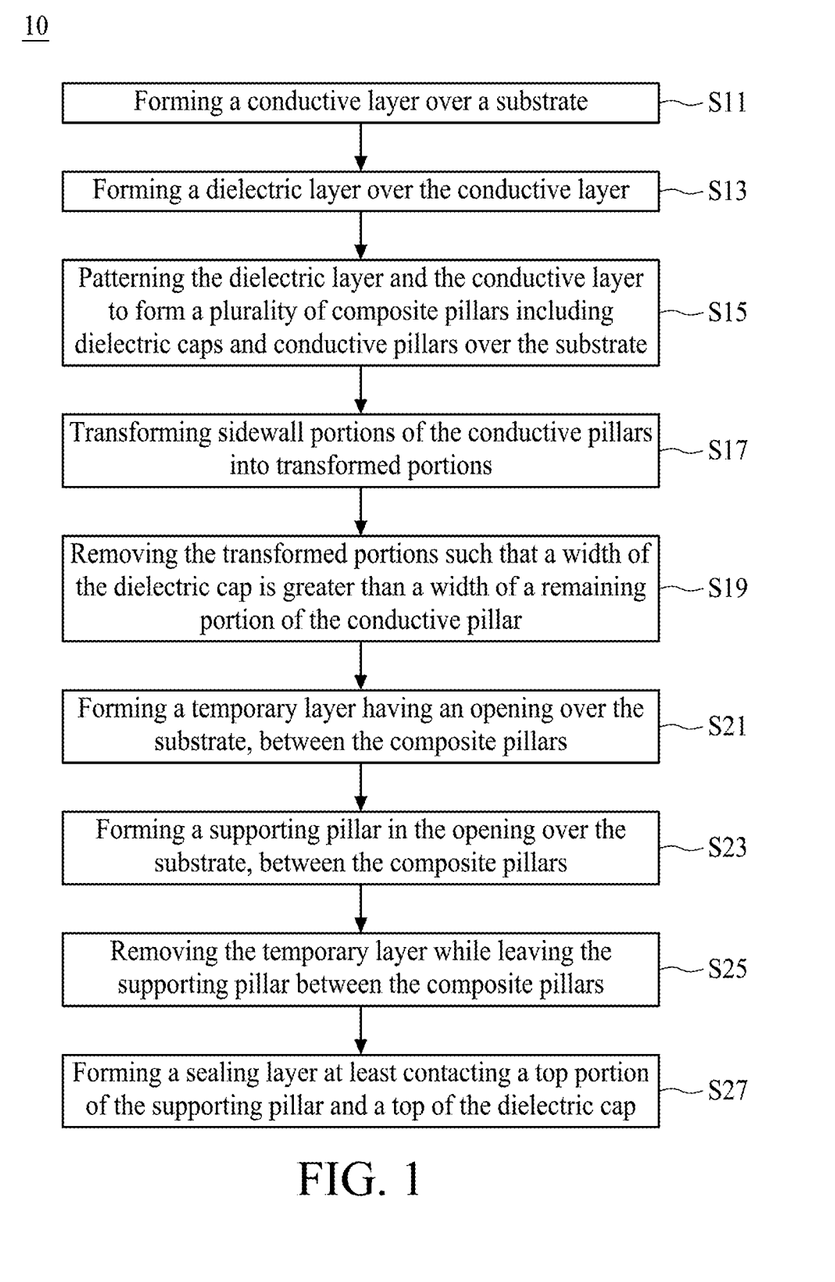
FIG. 1 is a flow diagram illustrating a method of forming a semiconductor device, in accordance with some embodiments of the present disclosure.

FIG. 1 is a flow diagram illustrating a method 10 of forming a semiconductor device, in accordance with some embodiments of the present disclosure. The method 10 includes steps S11, S13, S15, S17, S19, S21, S23, S25 and S27.

The steps S11 to S27 of FIG. 1 are first introduced briefly and then elaborated in connection with FIGS. 2 to 11. The method 10 begins at step S11, in which a conductive layer is formed over a substrate. In some embodiments, the substrate includes various passive and active microelectronic devices, and the conductive layer is used to form electrical connections between the microelectronic devices and other devices formed over the conductive layer. At step S13, a dielectric layer is formed over the conductive layer.

At step S15, the dielectric layer and the conductive layer are then patterned to form a plurality of composite pillars over the substrate, wherein the composite pillars include conductive pillars and dielectric caps over the conductive pillars, respectively. In some embodiments, the patterning process is performed on the dielectric layer and the conductive layer using a mask over the dielectric layer. At step S17, sidewall portions of the conductive pillars are transformed into transformed portions. In some embodiments, the transformed portions are formed by performing a thermal treatment process to transform the sidewall portions of the conductive pillars into dielectric portions.

At step S19, the transformed portions are removed such that a width of the dielectric cap is greater than a width of a remaining portion of the conductive pillar. In some embodiments, the etching selectivities of the transformed portions with respect to the dielectric caps are high. A step 21, a temporary layer having an opening is formed over the substrate, between the composite pillars. At step 23, a supporting pillar is formed in the opening over the substrate, between the composite pillars. At step 25, the temporary layer is removed while leaving the supporting pillar between the composite pillars.

At step S27, a sealing layer such as an inter-layer dielectric (ILD) layer is formed covering sidewalls of the dielectric structures. In some embodiments, the sealing layer at least contacts a top portion of the supporting pillar and a top of the dielectric cap, and air spacers are formed between the sealing layer, the supporting pillar and the remaining portions of the conductive pillars.

FIGS. 2 to 11 are schematic cross-sectional views illustrating various stages of forming a semiconductor device 100a by the method of FIG. 1 in accordance with some embodiments of the present disclosure.

Figure 2:
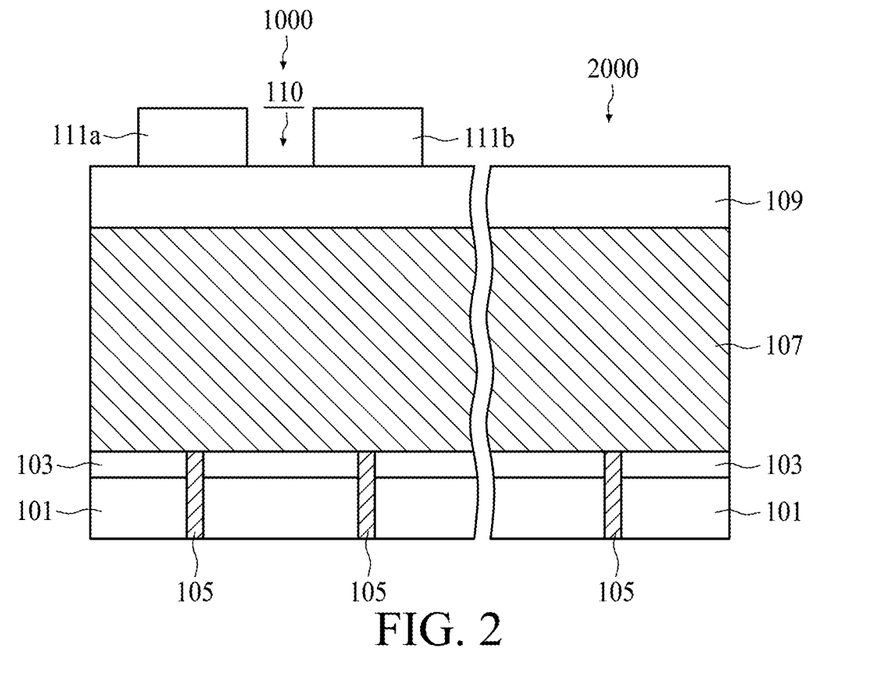
FIGS. 2 to 11 are schematic cross-sectional views illustrating various stages of forming a semiconductor device by the method of FIG. 1 in accordance with some embodiments of the present disclosure.

As shown in FIG. 2, a substrate 101 is provided or received. In some embodiments, the substrate 101 may include a semiconductor substrate such as a silicon substrate. In some embodiments, the substrate 101 includes other elementary semiconductor materials such as germanium (Ge). In some embodiments, the substrate 101 includes a compound semiconductor such as gallium arsenide, gallium phosphide, indium phosphide, indium arsenide, and/or indium antimonide. In some embodiments, the substrate 101 includes an alloy semiconductor such as SiGe, GaAsP, AlInAs, AlGaAs, GaInAs, GaInP, and/or GaInAsP. Alternatively, the substrate 101 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In addition, the substrate 101 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

Depending on the IC fabrication stage, the substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). For example, a dielectric layer 103 is formed over the substrate 101 as shown in FIG. 2. In some embodiments, the dielectric layer 103 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another suitable dielectric material, or a combination thereof.

The substrate 101 of FIG. 2 has been simplified for the sake of clarity. It should be noted that additional features can be added in the substrate 101, and some of the features described below can be replaced, modified, or eliminated in other embodiments.

In the depicted embodiment, a plurality of conductive vias 105 are formed in the substrate 101 and the dielectric layer 103. More specifically, the conductive vias 105 are formed penetrating through the dielectric layer 103 and the substrate 101. However, in other embodiments, the substrate 101 is not penetrated by the conductive vias 105. In some embodiments, the conductive vias 105 are disposed to form electrical connections between the devices in the semiconductor substrate 101 and other devices formed over the dielectric layer 103.

In some embodiments, the conductive vias 105 are made of copper (Cu), aluminum (Al), silver (Ag), tungsten (W), another conductive material, or a combination thereof, and the conductive vias 105 are formed by an etching process and a subsequent deposition process. In addition, the conductive vias 105 may be through-silicon vias or through-substrate vias (TSVs) in accordance with some embodiments.

Moreover, the substrate 101 includes a first region 1000 and a second region 2000. In some embodiments, the density of the devices in the first region 1000 of the substrate 100 is greater than the density of the devices in the second region 2000. Therefore, in these embodiments, the first region 1000 may be referred to as the pattern-dense region, and the second region 2000 may be referred to as the pattern-sparse region.

Still referring to FIG. 2, the method 100 at step S11 forms a conductive layer 107 over the dielectric layer 103, and the method 100 at step S13 forms a dielectric layer 109 over the conductive layer 107. In some embodiments, the conductive layer 107 is made of polycrystalline silicon (polysilicon), tungsten (W), aluminum (Al), copper (Cu), another conductive material, or a combination thereof, and the dielectric layer 109 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another applicable dielectric material, or a combination thereof. In addition, the conductive layer 107 and the dielectric layer 109 may be formed by deposition processes, such as chemical vapor deposition (CVD) processes, physical vapor deposition (PVD) processes, atomic layer deposition (ALD) processes, spin-coating processes, sputtering processes, other suitable processes, or combinations thereof.

Because the crosstalk problem (i.e., signal interference) between adjacent conductive structures (conductive layers) is more serious in the first region 1000 (i.e., the pattern-dense region) than in the second region 2000 (i.e., the pattern-sparse region), the following processes are performed on the first region 1000. However, these are merely examples and are not intended to be limiting. For example, in some other embodiments, the following processes are also performed on the second region 2000.

Figure 3:
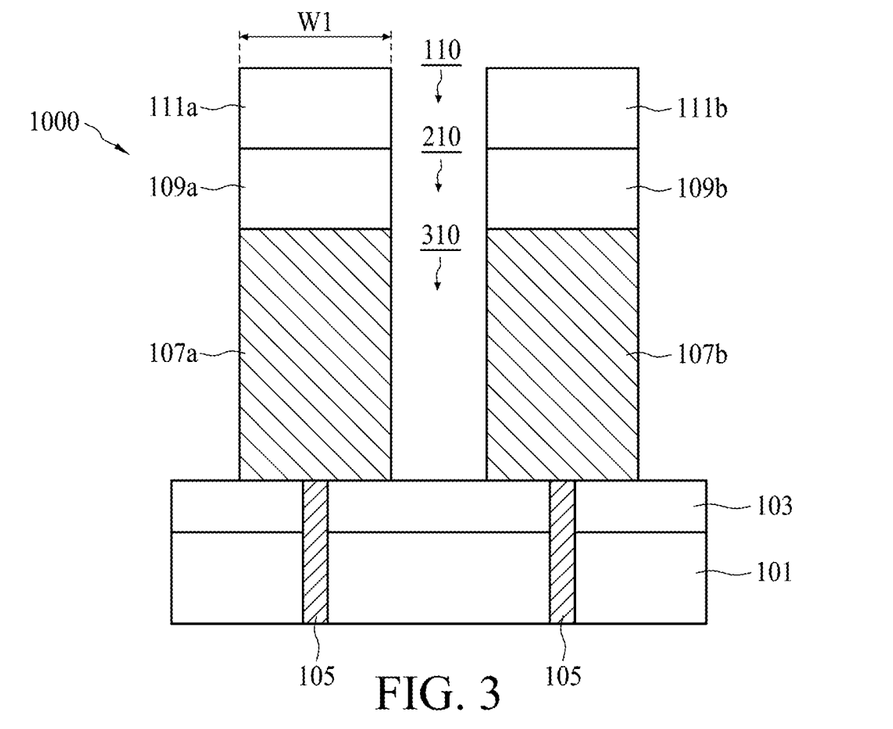

Referring to FIGS. 2 and 3, the method 100 at step S15 performs a patterning process on the dielectric layer 109 and the conductive layer 107 to form a plurality of composite pillars 106 over the substrate 101, wherein the composite pillars 106 include conductive pillars 107 and dielectric caps 109 over the conductive pillars 107, respectively. In some embodiments, the patterning process starts by forming a mask including a mask pattern 111*a* and a mask pattern 111*b* over the dielectric layer 109, wherein an opening 110 is formed between the mask patterns 111*a* and 111*b*, as shown in FIG. 2. The mask patterns 111*a* and 111*b* may be formed by depositing a mask layer (not shown) covering the dielectric layer 109. A patterned layer such as a photoresist layer (not shown) may then be formed over the mask layer.

The patterned layer may be formed by a deposition process and a patterning process. The deposition process for preparing the patterned layer may include a CVD process, a high-density plasma chemical vapor deposition (HDPCVD) process, a spin-coating process, a sputtering process, or another suitable process. The patterning process for preparing the patterned layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include dry etching (e.g., reactive-ion etching (RIE)), wet etching and/or other etching methods.

In some embodiments, the mask layer is made of silicon oxide, silicon nitride, silicon oxynitride, or another suitable material, and the mask layer may be formed by a deposition process, which may include a CVD process, an HDPCVD process, a spin-coating process, a sputtering process, or another suitable process. After the patterned layer is formed, the mask layer is etched using the patterned layer as a mask. As a result, the mask including the mask patterns 111*a* and 111*b* with the opening 110 between them is obtained. The patterned layer may then be removed.

Next, as shown in FIG. 3, the dielectric layer 109 and the conductive layer 107 are etched using the mask patterns 111*a* and 111*b* as a mask. As a result, a dielectric cap 109*a* and a dielectric cap 109*b* are formed with an opening 210 between them, and a conductive pillar 107*a* and a conductive pillar 107*b* are formed with an opening 310 between them. In some embodiments, the top surface of the dielectric layer 103 is exposed by the opening 310.

It should be noted that the dielectric layer 109 and the conductive layer 107 are etched using the same mask. Thus, the sidewalls of the conductive pillar 107*a* are substantially coplanar with the sidewalls of the dielectric cap 109*a*, and the sidewalls of the conductive pillar 107*b* are substantially coplanar with the sidewalls of the dielectric cap 109*b*, in accordance with some embodiments. Within the context of this disclosure, the word "substantially" means preferably at least 90%, more preferably 95%, even more preferably 98%, and most preferably 99%.

More specifically, the top surfaces of the conductive pillars 107*a* and 107*b* are entirely covered by the dielectric caps 109*a* and 109*b*. In some embodiments, as shown in the cross-sectional view of FIG. 3, the width of the dielectric cap 109*a* and the width of the conductive pillar 107*a* are substantially the same, and are defined as the width W1. Similarly, the width of the dielectric cap 109*b* and the width of the conductive pillar 107*b* are substantially the same. After the openings 210 and 310 are formed, the mask including the mask patterns 111*a* and 111*b* is removed.

Figure 4:
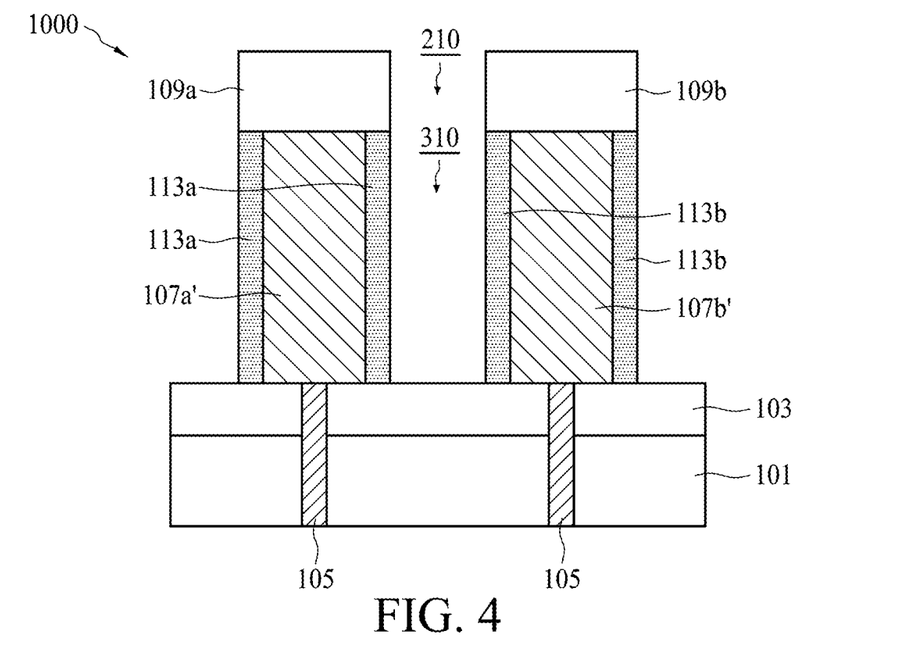

As shown in FIG. 4, the method 100 at step S17 transforms sidewall portions of the conductive pillar 107*a* and sidewall portions of the conductive pillar 107*b* into transformed portions 113*a* and 113*b*. As a result, the transformed portions 113*a* are formed over opposite sidewalls of the remaining portion of the conductive pillar 107*a*', and the transformed portions 113*b* are formed over opposite sidewalls of the remaining portion of the conductive pillar 107*b*'.

In some embodiments, the transformed portions 113*a* are covered by the dielectric cap 109*a*, and the transformed portions 113*b* are covered by the dielectric cap 109*b*. In some embodiments, the transformed portions 113*a* protrude from the sidewalls of the dielectric cap 109*a*, and the transformed portions 113*b* protrude from the sidewalls of the dielectric cap 109*b*. However, the transformed portions 113*a* and 113*b* are at least partially covered by the dielectric caps 109*a* and 109*b*, respectively.

Moreover, in some embodiments, the transformed portions 113*a* and 113*b* are formed by performing a thermal treatment process, which includes an oxidation process, a nitridation process, another suitable process or a combination thereof. In order to provide a high etching selectivity during the subsequent etching process, the material of the transformed portions 113*a* and 113*b* should be different from the material of the dielectric caps 109*a* and 109*b*. Therefore, the gas applied during the thermal treatment process is selected based on the material of the dielectric caps 109*a* and 109*b*.

For example, if the dielectric caps 109*a* and 109*b* are made of silicon oxide, nitrogen may be diffused into the sidewall surfaces of the conductive pillars 107*a* and 107*b* during the thermal treatment process (i.e., nitridation process), and the transformed portions 113*a* and 113*b* may be made of nitride, such as silicon nitride.

In addition, if the dielectric caps 109*a* and 109*b* are made of silicon nitride, oxygen may be diffused into the sidewall surfaces of the conductive pillars 107*a* and 107*b* during the thermal treatment process (i.e., oxidation process), and the transformed portions 113*a* and 113*b* may be made of silicon oxide ($SiO_2$), tungsten oxide (WO), aluminum oxide ($Al_2O_3$), copper oxide (CuO), or a combination thereof, depending on the material of the conductive pillars 107*a* and 107*b*.

Figure 5:
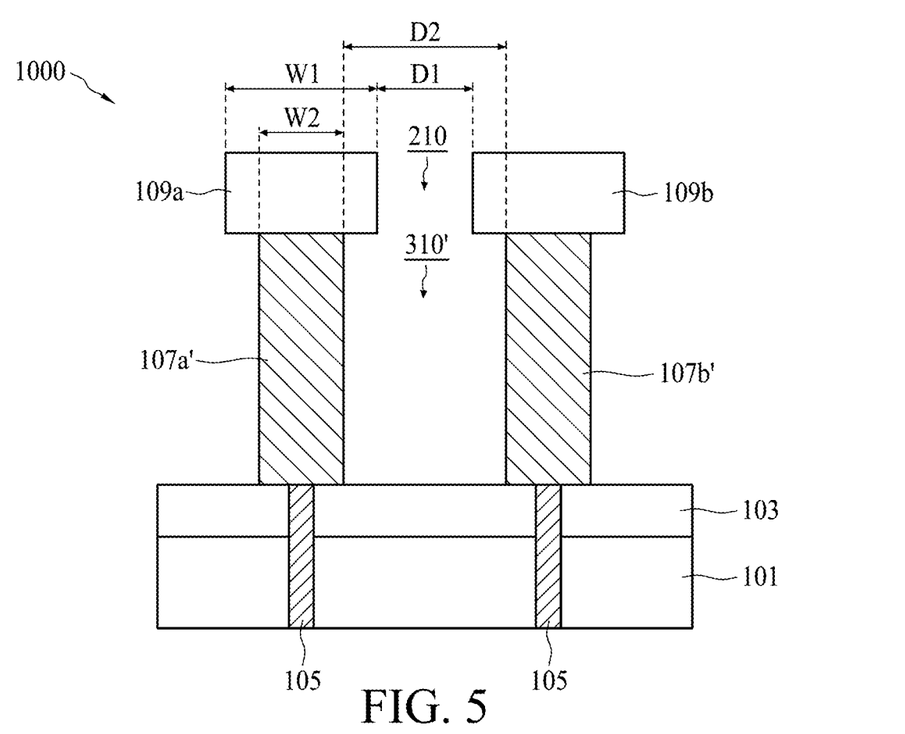

As shown in FIG. 5, the method 100 at step S19 removes the transformed portions 113*a* and 113*b*. In some embodiments, the transformed portions 113*a* and 113*b* are removed by an etching process. The etching process may include dry etching (e.g., RIE), wet etching and/or other etching methods.

In some embodiments, the materials of the transformed portions 113*a*, 113*b* and the dielectric caps 109*a*, 109*b* are selected such that the etching selectivities of the transformed portions 113*a*, 113*b* with respect to the dielectric caps 109*a*, 109*b* are high. Therefore, the transformed portions 113*a* and 113*b* are removed by the etching process while the dielectric caps 109*a* and 109*b* may be substantially left intact.

After the removal of the transformed portions 113*a* and 113*b*, an enlarged opening 310' is obtained. It should be noted that a distance D2 between the remaining portions of the conductive pillars 107*a*' and 107*b*' (i.e., the width of the enlarged opening 310') is greater than a distance D1 (i.e., the width of the opening 210) between the dielectric caps 109*a* and 109b, and a width W1 of the dielectric cap 109a is greater than a width W2 of the remaining portion of the conductive pillar 107a'. Similarly, a width of the dielectric cap 109b is greater than a width of the remaining portion of the conductive pillar 107b'.

Figure 6:
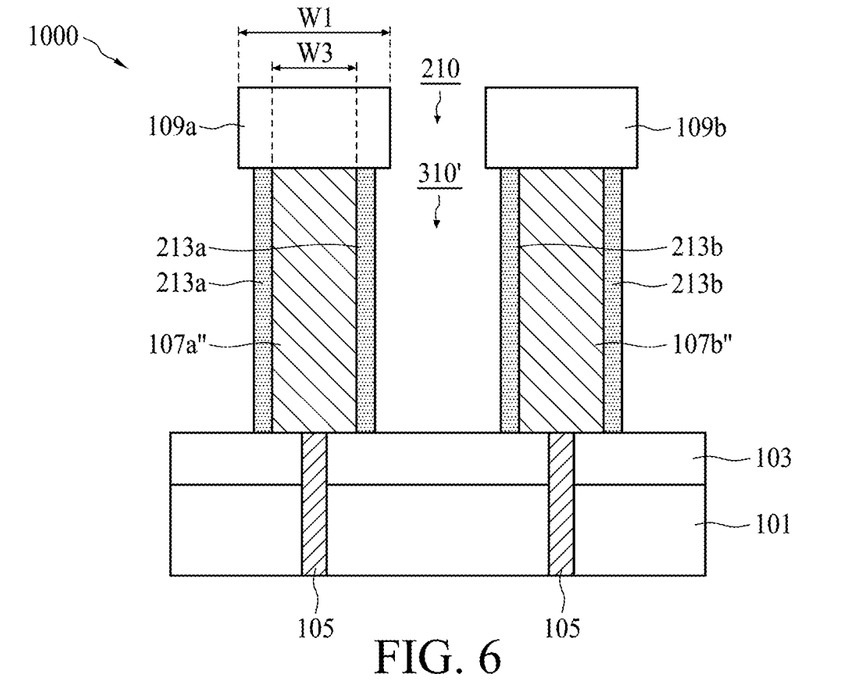

After the transformed portions 113a and 113b are removed, a second thermal treatment process may be performed on sidewalls of the remaining portions of the conductive pillars 107a' and 107b', as shown in FIG. 6 in accordance with some embodiments. The second thermal treatment process may be optionally performed. For example, in some embodiments, the second thermal treatment process can be omitted if the desired widths of the remaining portions of the conductive pillars 107a' and 107b' are reached after the transformed portions 113a and 113b are removed.

Referring to FIG. 6, after the second thermal treatment process is performed, sidewall portions of the remaining portions of the conductive pillars 107a' and 107b' are transformed into transformed portions 213a and 213b. As a result, transformed portions 213a and 213b are formed over sidewalls of the remaining portions of the conductive pillars 107a" and 107b", respectively. In some embodiments, a width W3 of the remaining portion of the conductive pillar 107a" is less than the width W2 of the remaining portion of the conductive pillar 107a' before the second thermal treatment process is performed (as shown in FIG. 5), and the width W2 is less than the width W1 of the dielectric cap 109a.

After the second thermal treatment process, the transformed portions 213a and 213b are removed by an etching process in accordance with some embodiments. Next, another thermal treatment process may be selectively performed until the desired widths of the remaining portions of the conductive pillars 107a" and 107b" are reached.

Figure 7:
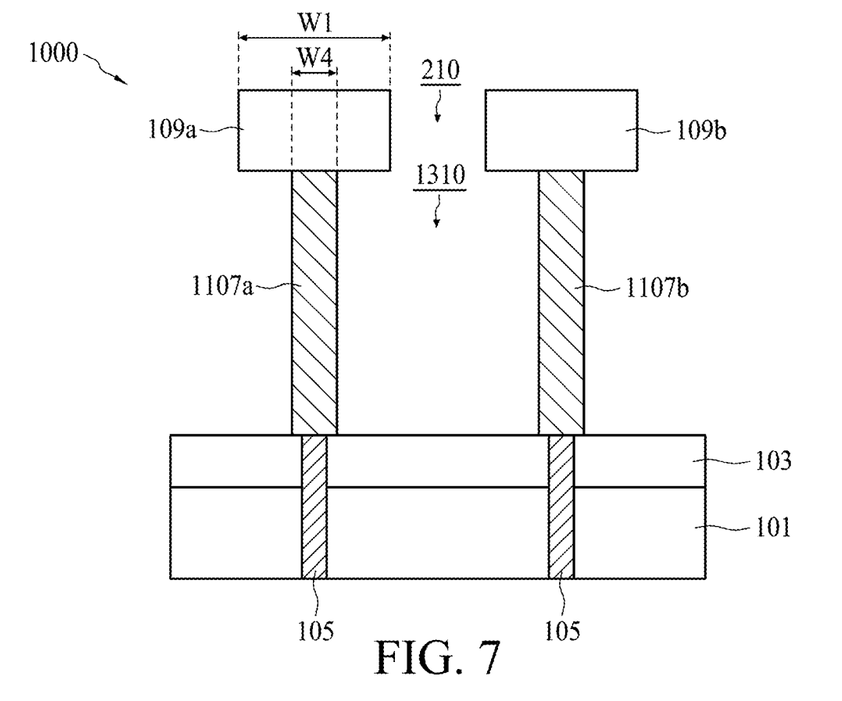

As shown in FIG. 7, remaining portions of the conductive pillars 1107a and 1107b are obtained once the desired widths are reached. In some embodiments, the remaining portions of the conductive pillars 1107a and 1107b are through-silicon vias or through substrate vias (TSVs). In some embodiments, the remaining portion of the conductive pillar 1107a has a width W4, which is less than the width W1 of the dielectric cap 109a. Similarly, a width of the remaining portion of the conductive pillar 1107b is less than the width W1 of the dielectric cap 109b.

Moreover, in some embodiments, the remaining portions of the conductive pillars 1107a and 1107b are separated by an opening 1310, which is wider than the enlarged opening 310' in FIG. 6. It should be noted that the remaining portions of the conductive pillars 1107a and 1107b are entirely covered by the dielectric caps 109a and 109b, respectively, and the conductive vias 105 are covered by the remaining portions of the conductive pillars 1107a and 1107b.

Figure 8:
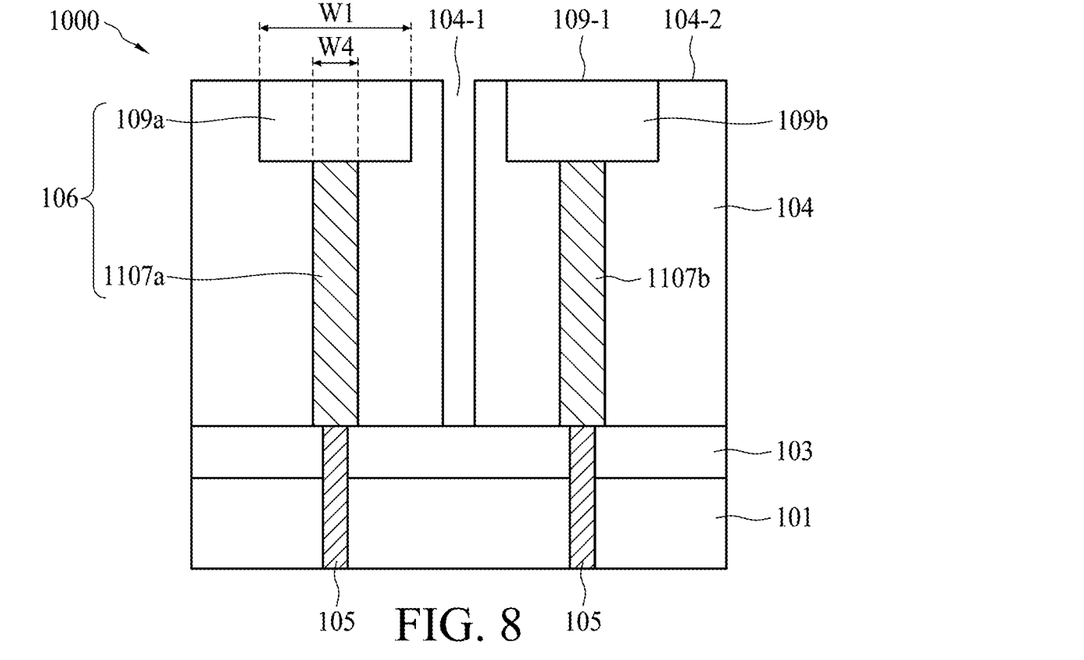

As shown in FIG. 8, the method 100 at step S21 forms a temporary layer 104 having an opening 104-1 over the dielectric layer 103, wherein the temporary layer 104 covers the conductive pillars 1107a and 1107b and the dielectric caps 109a and 109b, while expose the top surfaces of the dielectric caps 109a and 109b. In some embodiments, the top surface of the dielectric layer 103 is exposed by the opening 104-1. The temporary layer 104 may be formed by depositing a dielectric layer (not shown) over the dielectric layer 103, and a patterned layer such as a photoresist layer (not shown) may then be formed over the temporary layer 104. In some embodiments, the top end 104-2 of the temporary layer 104 is horizontally aligned with the top ends 109-1 of the dielectric caps 109a and 109b.

The patterned layer may be formed by a deposition process and a patterning process. The deposition process for preparing the patterned layer may include a CVD process, a high-density plasma chemical vapor deposition (HDPCVD) process, a spin-coating process, a sputtering process, or another suitable process. The patterning process for preparing the patterned layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include dry etching (e.g., reactive-ion etching (RIE)), wet etching and/or other etching methods.

In some embodiments, the temporary layer 104 is made of silicon oxide, silicon nitride, silicon oxynitride, or another suitable material, and the mask layer may be formed by a deposition process, which may include a CVD process, an HDPCVD process, a spin-coating process, a sputtering process, or another suitable process. After the patterned layer is formed, the temporary layer 104 is etched using the patterned layer as a mask. As a result, the temporary layer 104 with the opening 140-1 between the composite pillars 106 is obtained. The patterned layer may then be removed.

Figure 9:
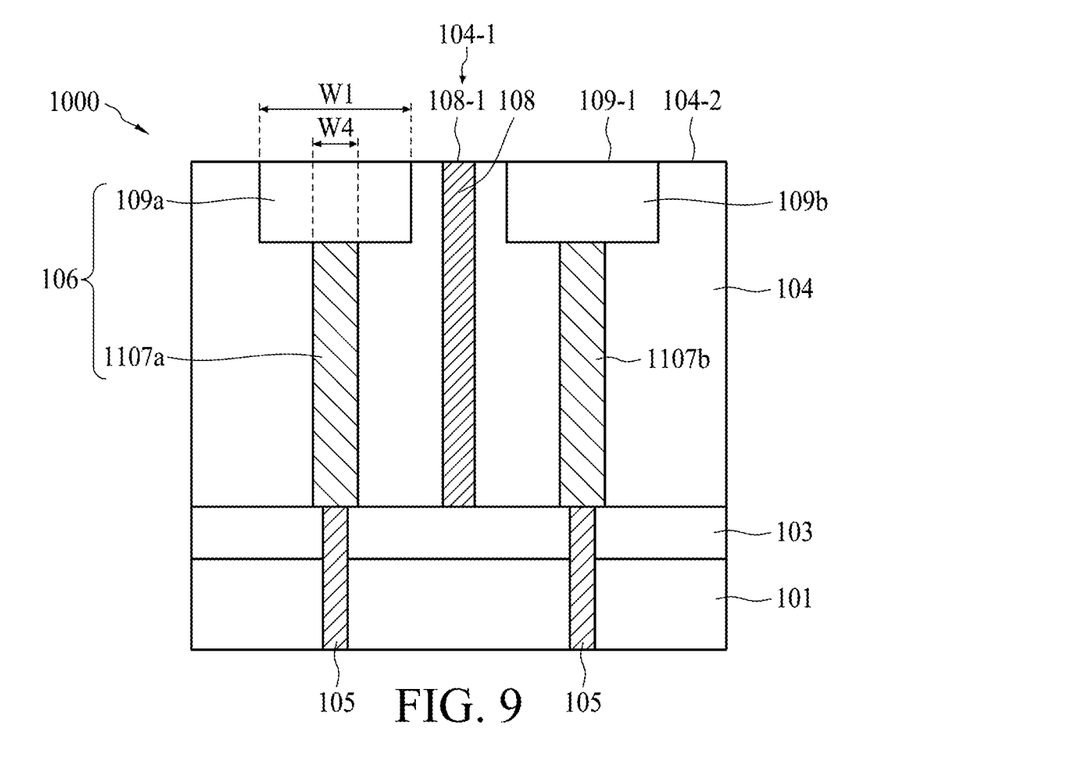

As shown in FIG. 9, the method 100 at step S23 forms a supporting pillar 108 in the opening 104-1, between the composite pillars 106 over the dielectric layer 103. In some embodiments, the forming of the supporting pillar 108 may include depositing a high-k dielectric material over the structure shown in FIG. 8, and performing an etching back process (or CMP process) to remove a portion of the deposited high-k dielectric material above the top ends 109-1 of the dielectric caps 109a and 109b, while leaving the deposited high-k dielectric material in the opening 104-1, forming the supporting pillar 108. In some embodiments, the top end 108-1 of the supporting pillar 108 is horizontally aligned with the top ends 109-1 of the dielectric caps 109a and 109b. In some embodiments, the top end 108-1 of the supporting pillar 108 is horizontally aligned with the top ends 104-2 of the temporary layer 104.

Figure 10:
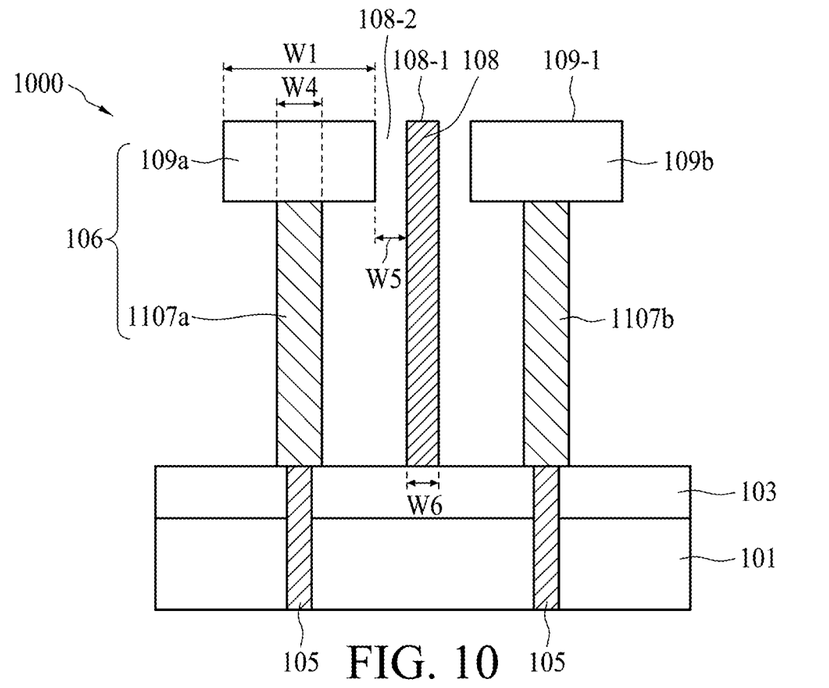

As shown in FIG. 10, the method 100 at step S25 removes the temporary layer 140 from the dielectric layer 103, while leaving the supporting pillar 108 and the composite pillars 106 over the dielectric layer 103. In some embodiments, the supporting pillar 108 is between the composite pillars 106, and separated from the composite pillars 106 by a space 108-2. In some embodiments, a width W5 of the space 108-2 is less than the width W1 of the dielectric cap 109a. In some embodiments, the width W5 of the space 108-2 is greater than the width W6 of the supporting pillar 108, and the width W5 of the space 108-2 is less than the width W4 of the remaining portion of the conductive pillars 1107a and 1107b. In some embodiments, the design of the supporting pillar 108 between the composite pillars 106 reduces the space between the two dielectric caps 109a and 109b down to the width W5, and the reduced space (the width W5) is more easier to be sealed by the subsequent process to form air space than the original space between the two dielectric caps 109a and 109b.

Figure 11:
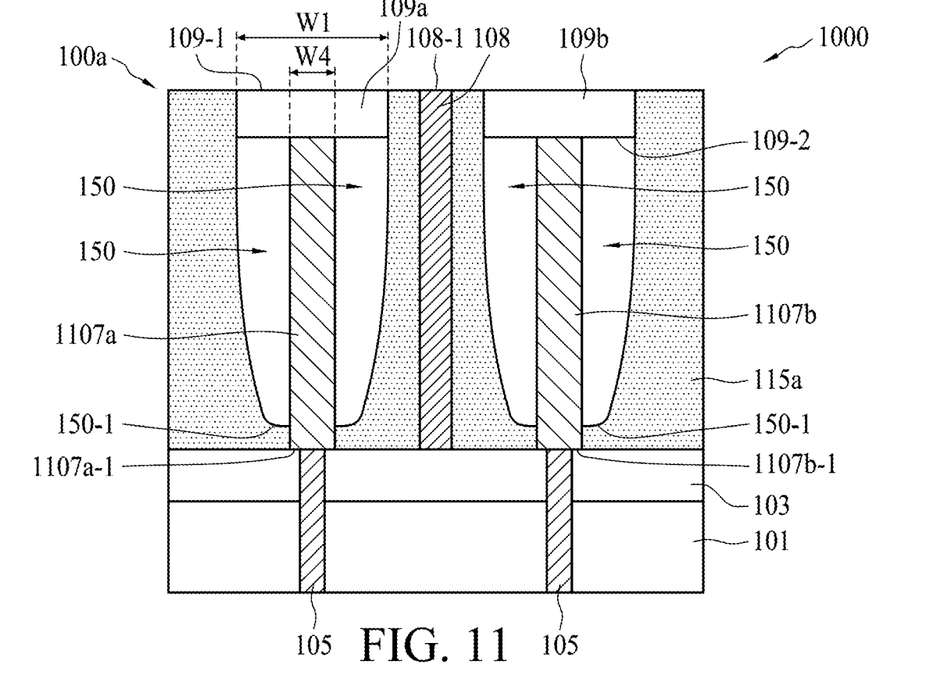

As shown in FIG. 11, the method 100 at step S27 forms a sealing layer 115a such as an inter-layer dielectric (ILD) layer at least contacting a top portion of the supporting pillar 108 and top portions of the dielectric caps 109a and 109b. Because the width W1 of the dielectric cap 109a is greater than the width W4 of the remaining portion of the conductive pillars 1107a and 1107b, an air spacer 150 are enclosed among the dielectric cap 109a, the remaining portion of the conductive pillars 1107a, the dielectric layer 103, and the sealing layer 115a. Similarly, the dielectric cap 109b, the remaining portion of the conductive pillar 1107b, the dielectric layer 103, and the sealing layer 115a enclose an air spacer 150.

It should be noted that the lower sidewalls of the remaining portions of the conductive pillars 1107a and 1107b are in direct contact with the sealing layer 115a, such that the bottom ends 150-1 of the air spacers 150 are higher than the bottom ends 1107a-1, 1107b-1 of the remaining portions of the conductive pillars 1107a and 1107b. In some embodiments, the bottom ends 150-1 of the air spacers 150 is closer to the bottom ends 1107a-1, 1107b-1 than to the bottom ends 109-2 of the dielectric caps 109a and 109b.

In some embodiments, referring back to FIG. 7, the sealing layer 115a is formed in the opening 210 between the dielectric caps 109a and 109b and the enlarged opening 1310 between the conductive pillars 1107a and 1107b, the opening 210 is entirely filled by the sealing layer 115a, and the enlarged opening 1310 is partially filled by the sealing layer 115a. More specifically, the widths of each of the air spacers 150 gradually decrease along a direction from the dielectric caps 109a and 109b to the substrate 101, in accordance with some embodiments.

In some embodiments, the sealing layer 115a is formed by a deposition process, such as a CVD process, a flowable CVD (FCVD) process, an HDPCVD process, an ALD process, a spin-coating process, another applicable process, or a combination thereof. In some embodiments, the sealing layer 115a is made of silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide.

After the deposition process for preparing the sealing layer 115a is performed, a planarization process may be performed to remove a portion of the sealing layer 115a and portions of the dielectric caps 109a and 109b, in order to correct deficiencies formed in the dielectric caps 109a and 109b during the previous etching processes. After the planarization process, a semiconductor device 100a is obtained.

Figure 12:
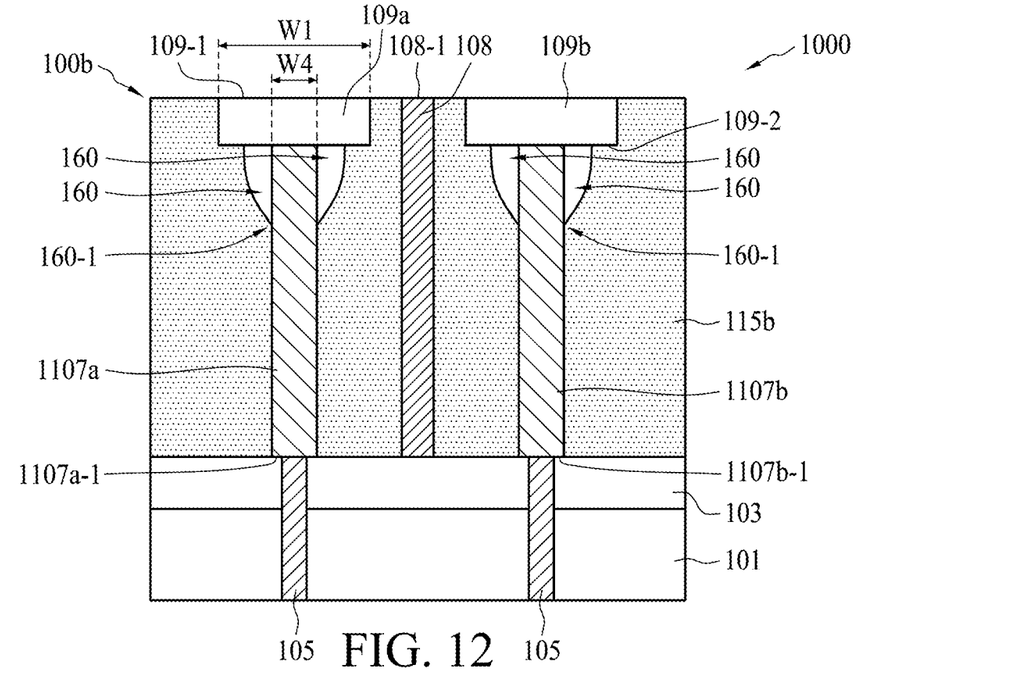
FIG. 12 is a schematic cross-sectional view of a semiconductor device in accordance with some embodiments of the present disclosure.

FIG. 12 is a schematic cross-sectional view of a semiconductor device 100b in accordance with some embodiments of the present disclosure. The semiconductor device 100b is similar to the semiconductor device 100a of FIG. 11, except for differences in profiles of the air spacers 160 and the sealing layer 115b.

As shown in FIG. 12, the sealing layer 115b is in direct contact with the bottom ends 109-2 of the dielectric caps 109a and 109b, and the occupied area of each of the air spacers 160 of the semiconductor device 100b is less than the occupied area of each of the air spacers 150 of the semiconductor device 100a in FIG. 11. It should be noted that the profiles of the air spacers 160 may be obtained when a material of the sealing layer 115b is selected to have a better step coverage (e.g., a step coverage better than that of the material of the sealing layer 115a in FIG. 11). In some embodiments, the material of the sealing layer 115b is selected to have a lower viscosity than that of the material of the sealing layer 115a in FIG. 11). In some embodiments, the bottom ends 150-1 of the air spacers 150 is closer to the bottom ends 1107a-1, 1107b-1 than to the bottom ends 109-2 of the dielectric caps 109a and 109b.

Figure 13:
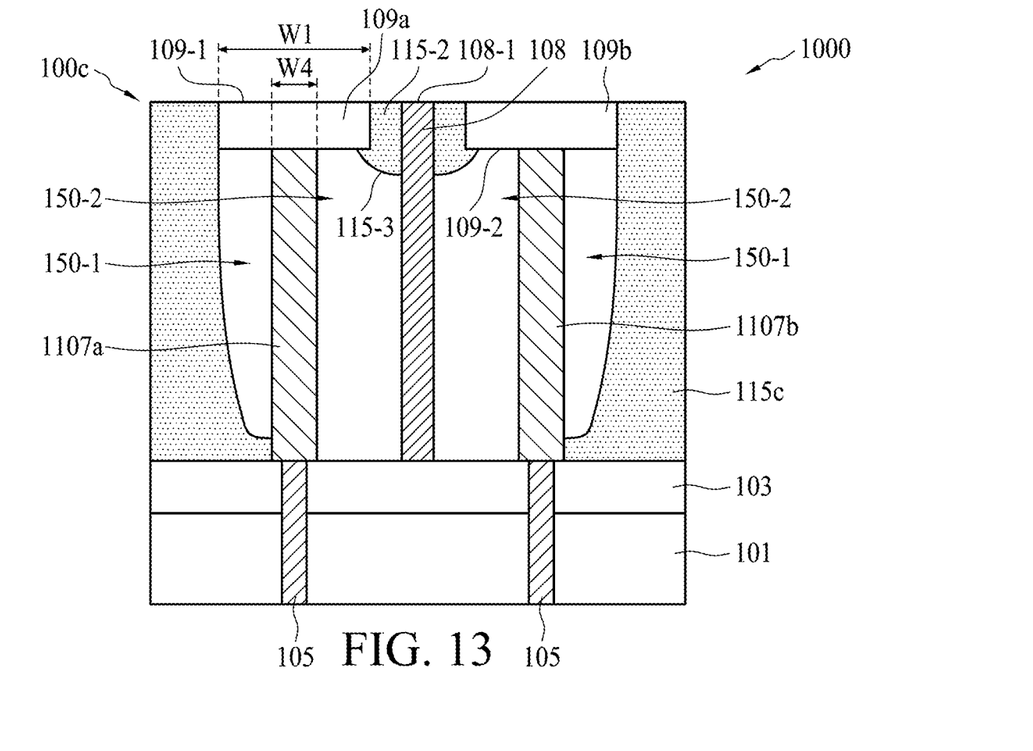
FIG. 13 is a schematic cross-sectional view of a semiconductor device in accordance with some embodiments of the present disclosure.

FIG. 13 is a schematic cross-sectional view of a semiconductor device 100c in accordance with some embodiments of the present disclosure. The semiconductor device 100c is similar to the semiconductor device 100a of FIG. 11, except for differences in location of the sealing layer 115c and the profiles of the air spacers 150-1, 150-2. It should be noted that the profile of the semiconductor device 100c may be obtained when a material of the sealing layer 115c is selected to have low step coverage (e.g., a step coverage lower than that of the material of the sealing layer 115a in FIG. 11).

As shown in FIG. 13, the sealing layer 115c includes an intervening portion 115-2 contacting the top portion of the supporting pillar 108 and the top portions of the dielectric caps 109a, 109b, between the supporting pillar 108 and the dielectric caps 109a, 109b (the conductive pillars 1107a and 1107b). In some embodiments, the intervening portion 115-2 has a bottom end 115-3 lower than the bottom ends 109-2 of the dielectric caps 109a, 109b. In some embodiments, the shape of the air spacer 150-1 at the left side of the conductive pillars 1107a is different from that of the air spacer 150-2 at the right side of the conductive pillars 1107a. In some embodiments, the size of the air spacer 150-1 at the left side of the conductive pillars 1107a is smaller than that of the air spacer 150-2 at the right side of the conductive pillars 1107a (the air spacer 150-2 between the supporting pillar 108 and the conductive pillars 1107a). In some embodiments, the air spacers 150-2 and the supporting pillar 108 and the intervening portion 115-2 serve as a composite decoupling structure, which decreases the electrical coupling of the conductive pillars 1107a and 1107b. In some embodiments, the design of the supporting pillar 108 between the composite pillars 106 changes the space between the two dielectric caps 109a and 109b down to the width W5 between the supporting pillar 108 and one of the dielectric caps 109a and 109b, and the reduced space (width W5) is more easier to be sealed by the sealing layer 115c to form the air spacer 105-2 than the original space between the two dielectric caps 109a and 109b.

Figure 14:
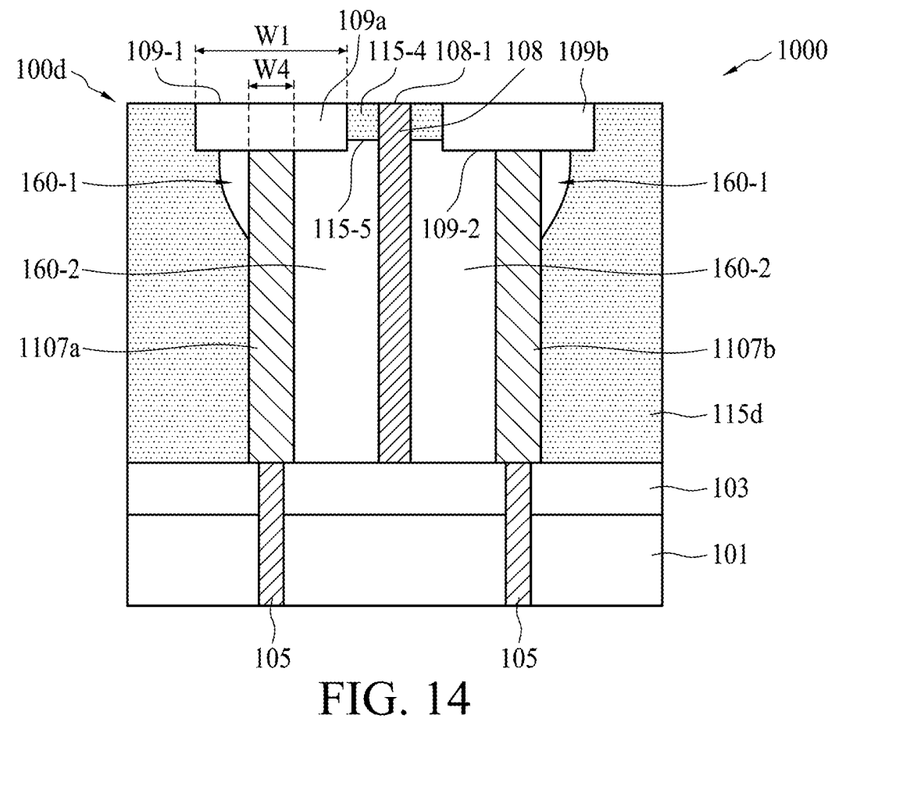
FIG. 14 is a schematic cross-sectional view of a semiconductor device in accordance with some embodiments of the present.

FIG. 14 is a schematic cross-sectional view of a semiconductor device 100d in accordance with some embodiments of the present disclosure. The semiconductor device 100d is similar to the semiconductor device 100c of FIG. 13, except for differences in in location of the sealing layer 115d and the profiles of the air spacers 160-1, 160-2.

As shown in FIG. 14, the sealing layer 115d includes an intervening portion 115-4 contacting the top portion of the supporting pillar 108 and the dielectric caps 109a, 109b. In some embodiments, the intervening portion 115-4 has a bottom end 115-5 higher than the bottom ends 109-2 of the dielectric caps 109a, 109b. In some embodiments, the shape of the air spacer 160-1 at the left side of the conductive pillars 1107a is different from that of the air spacer 160-2 at the right side of the conductive pillars 1107a. In some embodiments, the size of the air spacer 160-1 at the left side of the conductive pillars 1107a is smaller than that of the air spacer 160-2 at the right side of the conductive pillars 1107a (the air spacer 160-2 between the supporting pillar 108 and the conductive pillars 1107a). In some embodiments, the air spacers 16-2 and the supporting pillar 108 serve as a composite decoupling structure, which decreases the electrical coupling of the conductive pillars 1107a and 1107b.

Embodiments of a semiconductor device and method for preparing the same are provided. The method for preparing the semiconductor device includes transforming sidewall portions of the conductive pillars into transformed portions (e.g., transformed portions) by performing one or multiple repetitions of thermal treatment processes and removing the abovementioned transformed portions such that the width of each of the dielectric structures (e.g., dielectric caps) is greater than the width of each of the remaining portions of the conductive layers (e.g., remaining portions of the conductive pillars). As a result, after the sealing layer is formed covering sidewalls of the dielectric structures, air spacers are formed between the sealing layer and the remaining portions of the conductive layers.

The formation of the air spacers over the sidewalls of the conductive layers aids in the prevention of crosstalk (i.e., signal interference or coupling) between adjacent conductive pillars, and the performance of the semiconductor devices may be improved. Moreover, because the sealing layer is formed over opposite sidewalls of the conductive layers after the conductive layers are formed, a pinch-off problem near the top of the conductive layers and creation of voids or seams in the conductive layers can be prevented.

In one embodiment of the present disclosure, a method for preparing a semiconductor device is provided. The method includes forming a first conductive layer over a substrate, and forming a first dielectric structure over the first conductive layer. The method also includes transforming a sidewall portion of the first conductive layer into a first transformed portion, and removing the first transformed portion such that a width of the first dielectric structure is greater than a width of a remaining portion of the first conductive layer. The method further includes forming an inter-layer dielectric (ILD) layer covering a sidewall of the first dielectric structure such that a first air spacer is formed between the ILD layer and the remaining portion of the first conductive layer.

In addition, the design of the supporting pillar between the composite pillars changes the space between the two dielectric caps down to a reduced width (W5), and the reduced width (W5) is more easier to be sealed by the subsequent process (the sealing layer) to form air space than the original space between the two dielectric caps.

In one embodiment of the present disclosure, a semiconductor device is provided. The semiconductor device comprises a plurality of composite pillars disposed over a substrate, wherein the composite pillars include conductive pillars and dielectric caps over the conductive pillars; a supporting pillar between adjacent two of the plurality of composite pillars; and a sealing layer at least contacts a top portion of the supporting pillar and a top of the dielectric cap, and air spacers are formed between the sealing layer, the supporting pillar and the remaining portions of the conductive pillars.

The present disclosure also provide s a method for preparing a semiconductor device. The method comprises: forming a plurality of composite pillars over a substrate, wherein the composite pillars include conductive pillars and dielectric caps over the conductive pillars; transforming a sidewall portion of the conductive pillar into a first transformed portion; removing the first transformed portion such that a width of the dielectric cap is greater than a width of a remaining portion of the conductive pillar; forming a supporting pillar between adjacent two of the plurality of composite pillars; and forming a sealing layer at least contacts a top portion of the supporting pillar and a top of the dielectric cap, and air spacers are formed between the sealing layer, the supporting pillar and the remaining portions of the conductive pillars.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a plurality of composite pillars disposed over a substrate, wherein the composite pillars include conductive pillars and dielectric caps over the conductive pillars;
a first air spacer at one side of the conductive pillar and a second air spacer at the other side of the conductive pillar, wherein a first shape of the first air spacer is different from a second shape of the second air spacer;
a supporting pillar between adjacent two of the plurality of composite pillars; and
a sealing layer at least contacts a top portion of the supporting pillar and a top of the dielectric cap, and air spacers are formed between the sealing layer, the supporting pillar and the remaining portions of the conductive pillars.

2. The semiconductor device of claim 1, wherein a top end of the supporting pillar is horizontally aligned with a top end of the dielectric cap.

3. The semiconductor device of claim 1, wherein a width of the conductive pillar is smaller than a width of the dielectric cap.

4. The semiconductor device of claim 1, wherein the sealing layer has an intervening portion contacting the top portion of the supporting pillar and the top portion of the dielectric cap, and the intervening portion has a bottom end lower than a bottom end of the dielectric cap.

5. The semiconductor device of claim 1, wherein the sealing layer has an intervening portion contacting the top portion of the supporting pillar and the top portion of the dielectric cap, and the intervening portion has a bottom end higher than a bottom end of the dielectric cap.

6. The semiconductor device of claim 1, wherein a top end of the supporting pillar is higher than a bottom end of the dielectric cap.

7. The semiconductor device of claim 1, wherein a top end of the supporting pillar is higher than a top end of the conductive pillar.

8. A semiconductor device, comprising:
a plurality of composite pillars disposed over a substrate, wherein the composite pillars include conductive pillars and dielectric caps over the conductive pillars;
a first air spacer at one side of the conductive pillar and a second air spacer at the other side of the conductive pillar, wherein a first size of the first air spacer is different from a second size of the second air spacer;
a supporting pillar between adjacent two of the plurality of composite pillars; and a sealing layer at least contacts a top portion of the supporting pillar and a top of the dielectric cap, and air spacers are formed between the sealing layer, the supporting pillar and the remaining portions of the conductive pillars.

9. The semiconductor device of claim 8, wherein the first air spacer is between the supporting pillar and the conductive pillar, the second air spacer is at the other side of the conductive pillar, and the first air spacer is larger than the second air spacer.

* * * * *